United States Patent [19]

Akamatsu et al.

[11] Patent Number: 5,420,753

[45] Date of Patent: May 30, 1995

[54] STRUCTURE FOR COOLING AN INTEGRATED CIRCUIT

[75] Inventors: Shinya Akamatsu; Shinji Mine; Hideki Seguchi, all of Tokyo, Japan

[73] Assignee: NEC Corporation, Tokyo, Japan

[21] Appl. No.: 149,558

[22] Filed: Nov. 9, 1993

[30] Foreign Application Priority Data

Nov. 9, 1992 [JP] Japan .................. 4-297520

[51] Int. Cl.6 ............................. H05K 7/20
[52] U.S. Cl. .................. 361/719; 165/80.4; 257/713; 361/699; 361/705
[58] Field of Search .............. 174/16.3, 52.4; 165/104.33, 908, 80.4, 80.5; 257/712, 713, 714, 723, 724; 361/689, 690, 692, 693, 699, 702, 704, 705, 717–719, 736, 752

[56] References Cited

U.S. PATENT DOCUMENTS

| | | | |
|---|---|---|---|
| 4,193,445 | 3/1980 | Chu | 165/79 |
| 4,649,990 | 3/1987 | Kurihara | 165/80.4 |
| 4,748,495 | 5/1988 | Kuchasek | 357/82 |
| 4,825,284 | 4/1989 | Soga | 357/70 |
| 4,879,632 | 11/1989 | Yamamoto | 361/386 |
| 4,899,211 | 2/1990 | Dumoulin | 357/82 |
| 5,023,695 | 6/1991 | Umezawa et al. | |
| 5,050,037 | 9/1991 | Yamamoto | 361/385 |
| 5,155,660 | 10/1992 | Yamada | 361/386 |
| 5,227,663 | 7/1993 | Patil | 257/718 |
| 5,298,791 | 3/1994 | Liberty | 257/707 |

Primary Examiner—Gerald P. Tolin
Attorney, Agent, or Firm—Sughrue, Mion, Zinn, Macpeak & Seas

[57] ABSTRACT

In a structure for cooling an integrated circuit (IC), a hollow cylindrical member is mounted on a cold plate and receives a heat conductor therein. The heat conductor is a cylindrical member which is closed by a flat plate at one end thereof. Silicone gel fills a gap between the hollow cylindrical member and the heat conductor and allows the heat conductor to move due to the elasticity thereof. When the cold plate is fixed in place on the IC which is mounted on a printed circuit board, the heat conductor moves in matching relation to the height and inclination of the IC. As a result, the heat conductor and IC are brought into close contact with each other. A compound intervenes between the heat conductor and the IC to enhance the close contact of the heat conductor and IC.

15 Claims, 5 Drawing Sheets

STRUCTURE FOR COOLING AN INTEGRATED CIRCUIT

BACKGROUND OF THE INVENTION

The present invention relates to a structure for cooling an integrated circuit (IC) and, more particularly, to a structure for cooling an IC by transferring heat generated by the IC to a cooling fluid being circulated.

Cooling structures for the above application commonly include a heat conductor intervening between an IC and a cooling fluid or coolant. The heat conductor contacts the IC either directly or via a member having high thermal conductivity. Heat generated by the IC is transferred to the coolant via the heat conductor and then entrained by the coolant to the outside. With this kind of structure, it is possible to increase cooling efficiency by reducing heat resistance between the IC and the coolant. The heat resistance can be reduced if the heat conductor and IC are held in close contact over a broad area.

However, the close contact of the heat conductor and IC is susceptible to the irregularity in the height of the IC and the inclination of the IC. Specifically, when the height of the IC is short, a gap is left between the IC and the heat conductor. Further, when the upper surface of the IC is inclined, the heat conductor contacts only a part of the upper surface of the IC. Let the irregularity in the height of the IC and the inclination of the IC be referred to as factors obstructing contact. Such factors obstructing contact are particularly problematic when a plurality of heat conductors contact a plurality of ICs. In such a case, the heat conductors have to be adjusted in height and inclination one by one in matching relation to the heights and inclinations of the associated ICs.

An IC cooling structure elaborated to eliminate the factors obstructing contact and insure the close contact of the heat conductor and IC is taught in, for example, U.S. Pat. No. 5,023,695. This U.S. Patent shows in FIG. 1 thereof a conventional cooling structure having an IC 101 mounted on a printed circuit board 102, a piston 104 having a spherical portion contacting the IC 101, a hat or cooling plate 106 accommodating the piston 104, a spring 105 urging the piston 104 against the IC 101, and a coolant 109. The piston 104 and hat 106 constitute a heat conductor in combination. Heat generated by the IC 101 is transferred to the coolant 109 via the piston 104 and hat 106. Since the spring 105 constantly urges the piston 104 against the IC 101, the piston 104 remains in contact with the IC 101 with no regard to the height of the IC 101. Further, since the tip of the piston 104 is spherical, the piston 104 and IC 101 contact each other over a substantially constant area with no regard to the inclination of the IC 101.

The above U.S. Patent shows another conventional cooling structure in FIG. 2 thereof. In the structure of FIG. 2, a chip 201 is mounted on a printed circuit board 202 while a heat-conducting substrate 203 is provided on the chip 201. An elastic heat-conducting material 204 is provided on the substrate 203. A heat-conducting plate 205 is positioned on the heat-conducting material 204 and retained by a thin flexible bellows 207 made of metal. Heat generated by the chip 201 is transferred to the coolant via the substrate 203, elastic material 204, and plate 205. The plate 205 implements the heat conductor. The bellows 207 is flexible in the up-and-down direction and maintains the plate 205 in contact with the elastic material 204 with no regard to the height of the chip 201. In addition, the plate 205 inclines in association with the inclination of the chip 201. Hence, the entire surface of the plate 205 and the elastic material 204 contact each other even when the chip 201 is inclined.

However, the conventional structures shown in FIGS. 1 and 2 of the above U.S. Patent have the following problems. In the structure of FIG. 1, the heat conductor is constituted by two independent members, i.e., piston 104 and hat 106. Helium gas 100 fills a gap between the piston 104 and the hat 106 to effect heat transfer. However, since the heat transfer coefficient of the Helium gas 100 is smaller than the heat transfer coefficient of the piston 104 and that of the hat 106, the heat resistance of the heat conductor is high. Moreover, in this conventional structure, the contact of the IC 101 and piston 104 is implemented by a spherical surface, so that the contact area is small. Consequently, the heat resistance between the IC 101 and the piston 104 is increased.

The structure of FIG. 2 includes the thin bellows 207 made of metal. It is likely that such a bellows 207 corrodes when use is made of water or similar coolant. When a hole is formed in the bellows 207 due to corrosion, the coolant will flow out therethrough and cause electronic parts arranged on a circuit board 202 to fail.

SUMMARY OF THE INVENTION

It is, therefore, an object of the present invention to provide an IC cooling structure in which a heat conductor is held by an elastic material to enhance cooling efficiency and reliability.

In accordance with the present invention, a structure for cooling an IC comprises a printed circuit board, an IC mounted on the printed circuit board, a cold plate provided on the printed circuit board, a hollow cylindrical member mounted on the cold plate, a heat conductor comprising a hollow cylindrical portion and a flat portion closing one end of the hollow cylindrical portion, the hollow cylindrical portion being inserted in the hollow cylindrical member while the flat portion contacting the IC, an elastic material injected into a gap between the hollow cylindrical member and the heat conductor to hold the heat conductor, and a passageway formed in the cold plate for feeding a cooling fluid into the heat conductor. Also, in accordance with the present invention, a structure for cooling an IC comprises a printed circuit board, an IC mounted on the printed circuit board, a cold plate provided on the printed circuit board, a passageway formed in the cold plate for causing a cooling fluid to flow therethrough, a hole formed in the cold plate and communicating to the passageway, a heat conductor received in the hole and contacting the IC, and an elastic material holding the heat conductor on the cold plate.

BRIEF DESCRIPTION OF THE DRAWINGS

The above and other objects, features and advantages of the present invention will become more apparent from the following detailed description taken with the accompanying drawings in which.

DESCRIPTION OF THE PREFERRED EMBODIMENTS

Figure 1:
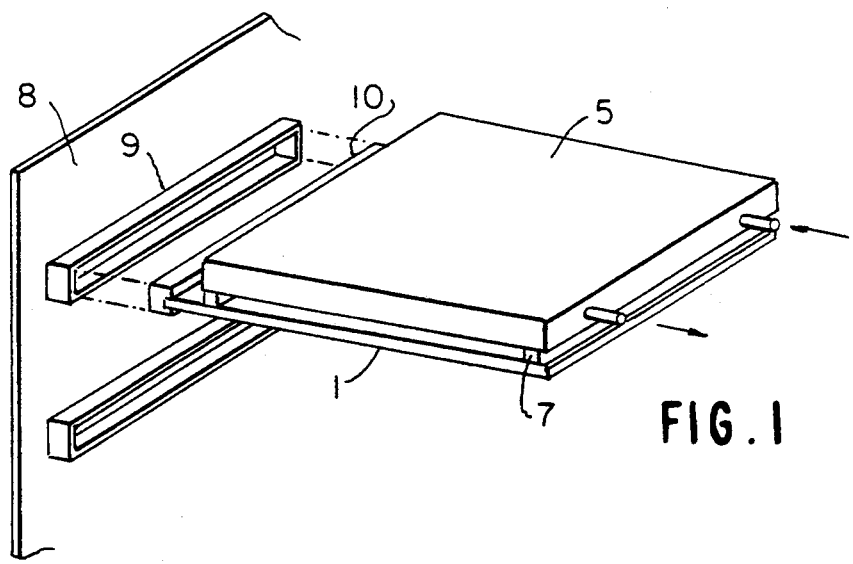
FIG. 1 is a perspective view of the general construction of an IC cooling structure in accordance with the present invention.

Referring to FIG. 1 of the drawings, there is shown the general construction of an IC cooling structure which applies to all the preferred embodiments to be described. As shown, a printed circuit board 1 is loaded with a plurality of ICs. Support members 7 are affixed to the upper surface of the circuit board 1, while a cold plate 5 is securely mounted on the support members 7. Connectors 10 and 9 are affixed to the circuit board 1 and a mother board 8, respectively. When the connector 10 is inserted into the connector 9, the circuit board 1 is electrically connected to the mother board 8. It should be noted that the arrangement shown in FIG. 1 is merely representative of major characteristics included in the structure of the present invention and will be modified in various ways to suit an application.

Figure 2:
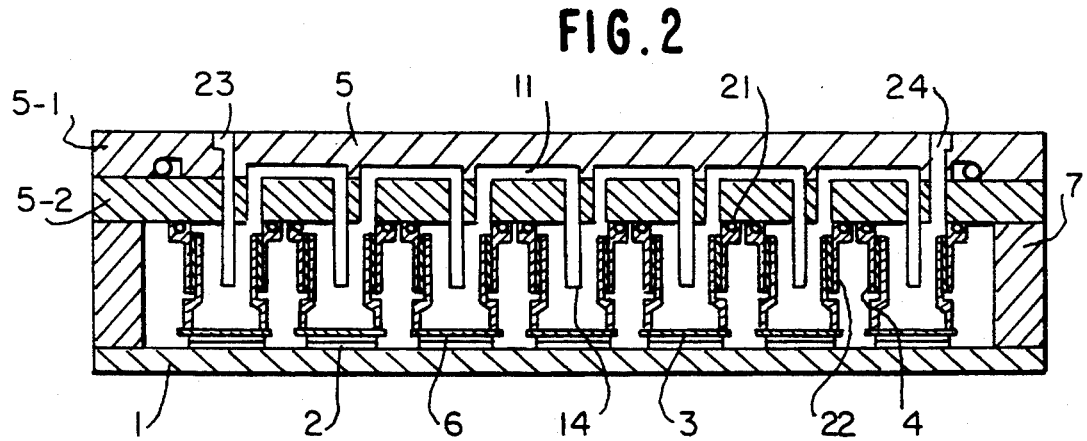
FIG. 2 is a section showing a first embodiment of the cooling structure in accordance with the present invention.

As shown in FIG. 2, a first embodiment of the present invention comprises a printed circuit board 1, ICs 2, heat conductors 3, silicone gel 4, the cold plate 5, a compound 6, the support members 7, a coolant passageway 11, nozzles 14, O-rings 21, hollow cylindrical members 22, a coolant inlet 23, and a coolant outlet 24. The cylindrical members 22 are affixed to the cold plate 5. The O-rings 21 are each received in a groove formed in a portion where the associated cylindrical member 22 and the cold plate 15 join each other. The O-rings 21 prevents a coolant from leaking from the interior of the cylindrical member 22. The cylindrical members 22 are associated one-to-one with the ICs 2 and positioned just above the ICs.

The heat conductors 3 are each received in respective cylindrical member 22 and formed into a hollow cylindrical configuration closed at one end thereof. The heat conductors 3 have a greater diameter than the cylindrical members 22. The closed end of each heat conductor 3 is flat. The heat conductors 3 are made of a material having high thermal conductivity, high resistivity to water, and high adhesion to the silicone gel 4. Copper is one of the materials satisfying such three conditions. The heat conductors 3 are provided with strength great enough to withstand the pressure of a coolant and erosion. This degree of strength can be implemented if the thickness of the heat conductors 3 is increased. The heat conductors 3 are received in the associated cylindrical members 22 such that their closed ends face the ICs 2.

The silicone gel 4 fills the gaps between the cylindrical members 22 and the associated heat conductors 3, thereby bonding them to each other. Each cylindrical member 22 and respective heat conductor 3 form a cup-like receptacle. The silicone gel 4 has elasticity and allows the heat conductors 3 to move in the up-and-down direction and to incline. Such a movement of the heat conductors 3 is caused by an external force. When the extraneous force is removed, the heat conductors 3 return to their original position due to the elasticity of the silicone gel 4. The range over which the heat conductors 3 are movable depends on the material and thickness of the silicone gel 4.

Why the silicone gel 4 is selected as a member for bonding the cylindrical members 22 and heat conductors 3 is that it is chemically stable and desirably elastic. Such properties of the silicone gel 4 are achievable not only in air but also in water. The silicone gel 4 applicable to the illustrative embodiment should preferably satisfy three different conditions, i.e., high resistivity to shear stresses, a broad range of usable temperatures, and resistivity to water. Preferably, the silicone gel 4 should be usable at temperatures of −50° C. to 200° C.

The cold plate 5 has the inlet 23, outlet 24 and passageway 11 for a coolant. The passageway 11 is communicated to nozzles 14 each of which extends into respective heat conductor 3. In this configuration, a coolant jets from each nozzle 14 toward the flat closed end of the associated heat conductor 3. To provide the cold plate 5 with the passageway 11, a flat member 5-1 is formed with grooves which constitute the horizontal portions of the passageway 11. Then, a flat member 5-2 is formed with through holes to constitute the vertical portions of the passageway 11. Finally, the flat portions 5-1 and 5-2 are joined with each other.

The ICs 2 mounted on the circuit board 1 are positioned such that their heat radiating surfaces face upward. The compound 6 is adhered to each IC 2 and implemented by a flexible substance which is the mixture of silicone oil or similar base material and a filler. The filler comprises an electrically insulating and thermally conductive material, e.g., metal oxide or boron nitride. The filler provides the compound 6 with high thermal conductivity. Specifically, from the heat conduction and economy standpoint, it is preferable to use an epoxy resin as the base material and to mix silver therewith as the filler.

The support members 7 are affixed to the upper surface of the circuit board 1. The cold plate 5 carrying the cylindrical members 22 and heat conductors 3 thereon is affixed to the support members 7. At this instant, the flat portions of the heat conductors 3 are pressed against the associated ICs 2, while the heat conductors 3 are each moved in matching relation to the height and inclination of the underlying IC 2. As a result, the upper surfaces of the ICs 2 and the flat portions of the associated heat conductors 3 are brought into close contact with each other. At the same time, the compound 6 intervening between the ICs 2 and the heat conductors 3 is squeezed flat, thereby filling up the gaps between the upper surfaces of the ICs and the heat conductors 3. This further enhances the close contact of the ICs 2 and heat conductors 3. In this manner, the deformation of the silicone gel 4 and that of the compound 6 eliminate the factors obstructing contact as stated previously.

In operation, a coolant is introduced into the passageway 11 via the inlet 23. The coolant jets from the nozzle 14 of the passageway 11 toward the flat portion of the heat conductor 3 in which the nozzle 14 is disposed, and then strikes against the flat portion. Heat generated by the IC 2 is absorbed by the coolant filling the heat conductor 3 via the flat portion of the heat conductor. Subsequently, the coolant flows into the following portion of the passageway 11 and then jets into the next heat conductor 3 via the associated nozzle 14. The coolant that has flown through all the heat conductors 3 is discharged from the outlet 24.

In the event of repair, the heat conductors 3 can be pulled out of the associated cylindrical members 22. Also, by pulling out the heat conductors 3, it is possible to remove impurities deposited therein. After the repair, the heat conductors 3 are again inserted into the cylindrical members 22, and then the silicone gel 4 is injected into the gaps between the heat conductors 3 and the cylindrical members 22.

The embodiment described above has the following advantages. Since the heat conductors 3 are each implemented as a single member, they exhibit high thermal conductivity. Since the flat portions of the heat conductors 3 contact the associated ICs 2, the heat conductors 3 and ICs 2 contact each other over a broad area. In addition, the heat conductors 3 are strong enough to allow a minimum of damage thereto to occur.

Figure 3:
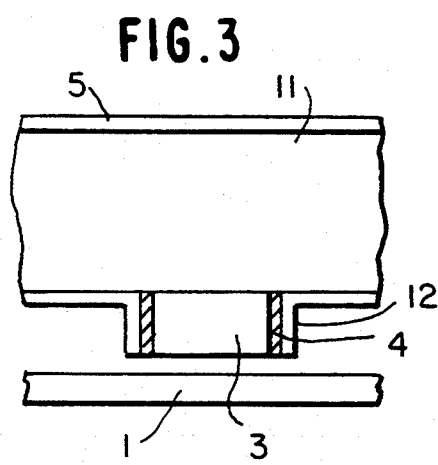
FIG. 3 is a fragmentary section showing a second embodiment of the present invention.

Referring to FIG. 3, a second embodiment of the present invention comprises the heat conductor 3, silicone gel 4, cold plate 5, and passageway 11. The members constituting the embodiment are made of the same materials as the members of the first embodiment.

The cold plate 5 is formed with a circular hole through the lower portion thereof, and a flange 12 surrounding the hole. The heat conductor 3 is formed into a cylindrical configuration and inserted in the hole of the cold plate 5. The silicone gel 4 fills the gap between the flange 12 and the heat conductor 3, thereby bonding them together. The heat conductor 3 is movable due to the elasticity of the silicone gel 4.

Figure 4:
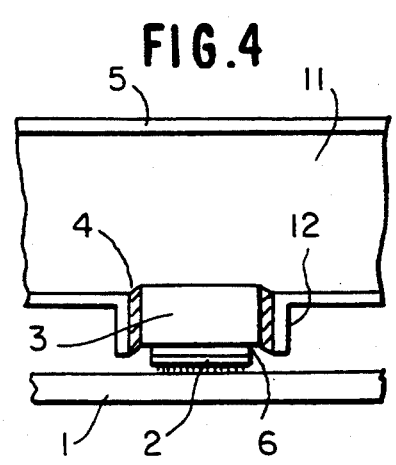
FIG. 4 is a fragmentary section showing the second embodiment mounted on an IC.

As shown in FIG. 4, the cold plate 5 is affixed to the printed circuit board 1. At this instant, the heat conductor 3 is pressed against the IC 2 mounted on the circuit board 1, while moving in matching relation to the height and inclination of the IC 2. As a result, the upper surface of the IC 2 and the flat portion of the heat conductor 3 are brought into close contact with each other. At the same time, the compound 6 intervening between the IC 2 and the heat conductor 3 is squeezed flat, filling up the gap between the top of the IC 2 and the flat portion of the heat conductor 3. This further enhances the close contact of the IC 2 and heat conductor 3. The silicone gel 4 and compound 6, therefore, eliminate the factors obstructing contact due to their deformation.

The embodiment described above achieves the same degree of cooling efficiency and reliability as the previous embodiment, while having a simpler construction.

Figure 5:
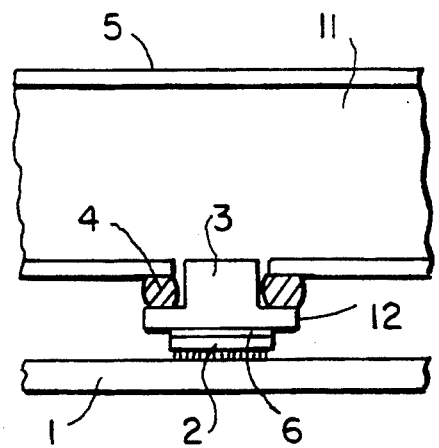
FIGS. 5-16 are fragmentary sections showing a third to a fourteenth embodiment of the present invention, respectively.

Referring to FIG. 5, a third embodiment of the present invention comprises the printed circuit board 1, IC 2, heat conductor 3, silicone gel 4, cold plate 5 and compound 6. The cold plate 5 is formed with a hole, as in the second embodiment. The heat conductor 3 is received in the hole of the cold plate 5 and implemented as a cylinder having a flange 12. The silicone gel 4 is injected into the gap between the flange 12 and the cold plate 5 so as to bond the heat conductor 3 and cold plate 5. The heat conductor 3 is movable due to the elasticity of the silicone gel 4.

In the first and second embodiments, the deformation of the silicone gel 4 is derived mainly from a shear stress. By contrast, in this embodiment, the silicone gel 4 deforms mainly on the basis of a normal stress. This is successful in achieving higher reliability regarding the bonding surfaces of the silicone gel 4.

Figure 6:
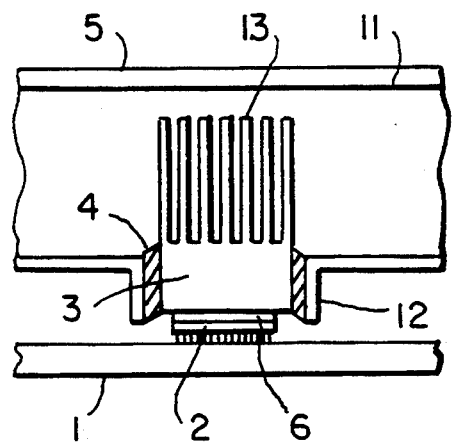

Referring to FIG. 6, a fourth embodiment of the present invention is essentially similar to the second embodiment, FIG. 4, except for the configuration of the heat conductor 3. As shown, fins 13 extend out from the top of the heat conductor 3. The heat conductor 3 is positioned such that the fins 13 extend in the same direction as the flow of the coolant so as not to obstruct the coolant.

Since the fins 13 have a broad surface area, heat from the heat conductor 3 is transferred to the coolant efficiently. This embodiment, therefore, achieves a cooling ability higher than that of the second embodiment.

Figure 7:
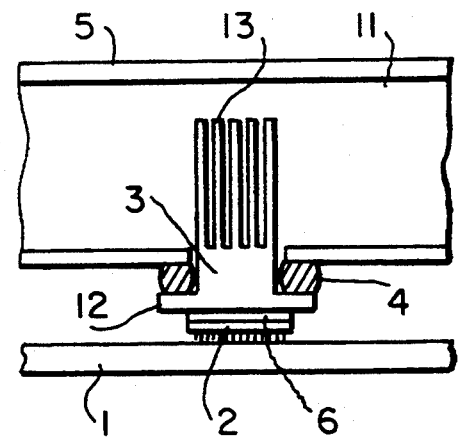

Referring to FIG. 7, fifth embodiment of the present invention is essentially similar to the third embodiment, FIG. 5, except for the configuration of the heat conductor 3. As shown, fins 13 extend out from the top of the heat conductor 3. The heat conductor 3 is positioned such that the fins 13 extend in the same direction as the flow of the coolant so as not to obstruct the coolant.

Since the fins 13 have a broad surface area, heat from the heat conductor 3 is transferred to the coolant efficiently. This embodiment, therefore, achieves a cooling ability higher than that of the third embodiment.

Figure 8:
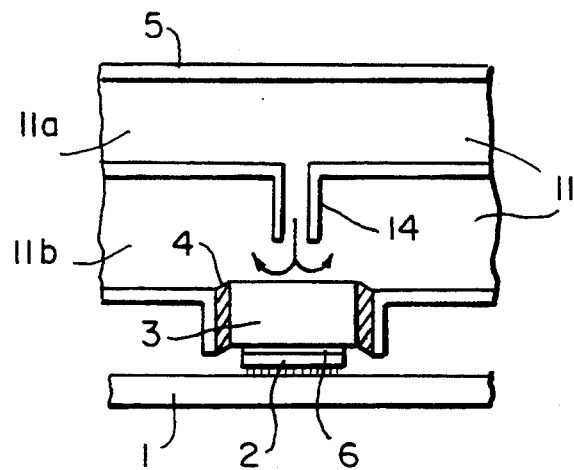

Referring to FIG. 8, a sixth embodiment of the present invention is essentially similar to the second embodiment, FIG. 4, except for the configuration of the passageway 11. As shown, the passageway 11 is divided into a first and a second passageway 11-$a$ and 11-$b$ by a wall. The wall partitioning the passageways 11-$a$ and 11-$b$ is formed with a hole in which the nozzle 14 is fitted. The coolant flowing through the passageway 11 jets toward the heat conductor 3 via the nozzle 14. When striking against the heat conductor 3, the coolant absorbs the heat of the heat conductor 3 efficiently.

This embodiment achieves higher cooling efficiency than the second embodiment since it causes the coolant to cool the heat conductor 3 by striking against the heat conductor 3.

Figure 9:
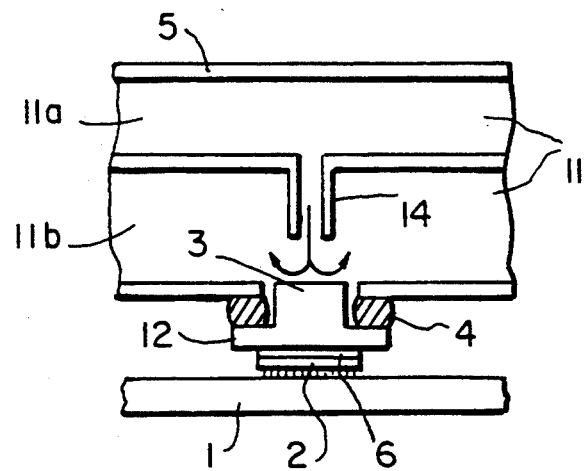

A seventh embodiment of the present invention is shown in FIG. 9 and essentially similar to the third embodiment, FIG. 5, except for the configuration of the passageway 11. As shown, the passageway 11 is divided into a first and a second passageway 11-$a$ and 11-$b$ by a wall. The wall partitioning the passageways 11-$a$ and 11-$b$ is formed with a hole in which the nozzle 14 is fitted. The coolant flowing through the passageway 11 jets toward the heat conductor 3 via the nozzle 14. When striking against the heat conductor 3, the coolant absorbs the heat of the heat conductor 3 efficiently.

This embodiment achieves higher cooling efficiency than the third embodiment since it causes the coolant to cool the heat conductor 3 by striking against the heat conductor 3.

Figure 10:
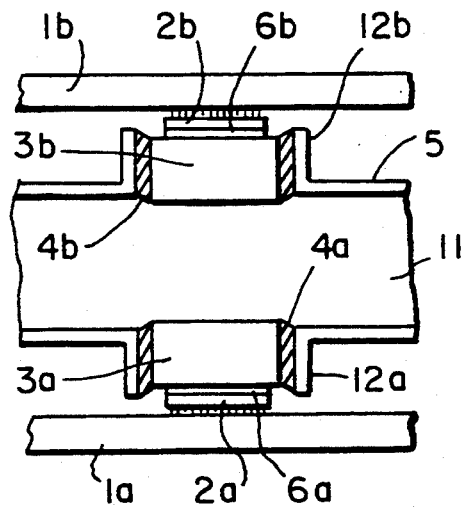

FIG. 10 shows an eighth embodiment of the present invention. As shown, the heat conductor 3 is provided on both of the upper and lower surfaces of the cold plate 5. The cold plate 5 is formed with a hole in each of the upper and lower walls thereof.

Specifically, a printed circuit board 1$a$, an IC 2$a$, a heat conductor 3$a$, silicone gel 4$a$, a compound 6$a$ and a flange 12$a$ are positioned on the lower portion of the cold plate 5 and respectively correspond to the circuit board 1, IC 2, heat conductor 3, gel 4, compound 6, and flange 12 of the second embodiment. The constituent parts 1$a$, 2$a$, 3$a$, 4$a$, 6$a$ and 12$a$ are assembled in the same manner as in the second embodiment. A printed circuit board 1$b$, an IC 2$b$, a heat conductor 3$b$, silicone gel 4$b$, a compound 6$b$ and a flange 12$b$ are provided on the upper portion of the cold plate 5 and respectively correspond to the constituents 1, 2, 3, 4, 6 and 12 of the second embodiment. The component parts 1$b$, 2$b$, 3$b$, 4$b$, 6$b$ and 12$b$ are also assembled in the same manner as in the second embodiment.

This embodiment is capable of cooling ICs at opposite surfaces of a single cold plate 5 and, therefore, enhances the packaging density of the circuit board 1. The major characteristic of the present embodiment is that a cooling structure is provided on both surfaces of the cold plate 5. It follows that any one of the structures of the embodiments may be provided on both surfaces of the cold plate 5 in place of the structure of the second embodiment. Moreover, the structures on the upper and lower surfaces of the cold plate 5 may even be different from each other.

Figure 11:
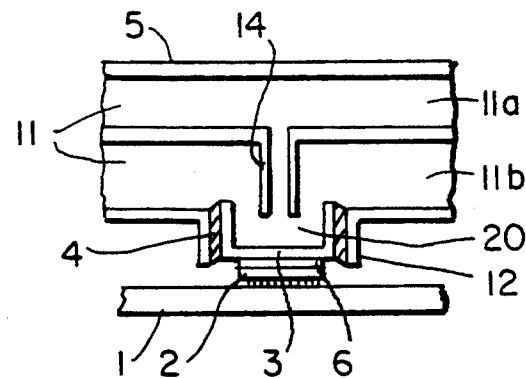

A ninth embodiment of the present invention will be described with reference to FIG. 11. This embodiment is essentially similar to the sixth embodiment, FIG. 8, except for the configuration of the heat conductor 3. As shown, the heat conductor 3 is formed with a recess 20 and inserted in the flange 12 such that the recess 20 faces the nozzle 14. The recess 20 reduces the distance between the IC 2 and the coolant, compared to the sixth embodiment. The coolant jetted from the nozzle 14 strikes against the bottom of the recess 20 and absorbs the heat of the heat conductor 3.

In this embodiment, the distance between the IC 2 and the coolant is shorter than in the sixth embodiment due to the recess 20, as stated above. Hence, this embodiment achieves further higher cooling efficiency than the sixth embodiment.

Figure 12:
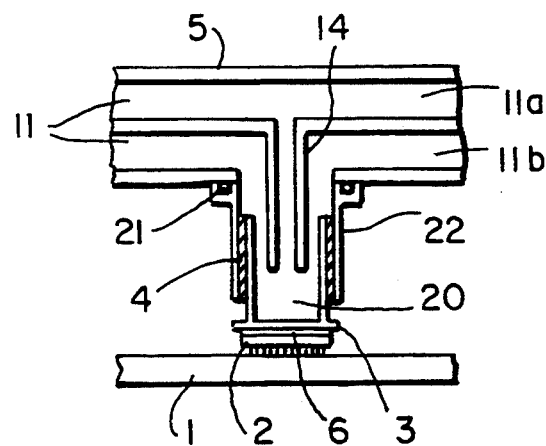

Referring to FIG. 12, a tenth embodiment of the present invention is essentially similar to the first embodiment except for the configuration of the passageway 11. As shown, the passageway 11 is divided into a first and a second passageway 11-a and 11-b, respectively. A hole is formed through the lower portion of the cold plate 5, while a hollow cylindrical member 22 is fitted in the hole. A hole is also formed through the wall partitioning the two passageways 11-a and 11-b. The nozzle 14 is fitted in the hole of this wall and extends through the hole of the cold plate 5 into the hollow cylindrical member 22. The coolant fed under pressure to the passageway 11 jets toward the heat conductor 3 via the nozzle 14. When striking against the heat conductor 3, the coolant absorbs the heat of the heat conductor 3 efficiently. The coolant absorbed the heat is discharged through the passageway 11-b.

In this embodiment, the coolant absorbed the heat of one heat conductor 3 is not fed to another heat conductor 3. This further enhances the cooling efficiency achievable with the first embodiment. Further, since the coolant of the same temperature is fed to all the heat conductors 3, the ICs 2 can be cooled evenly.

Figure 13:
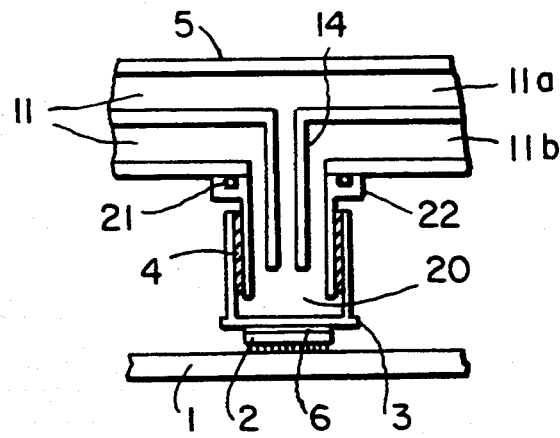

Referring to FIG. 13, an eleventh embodiment of the present invention is essentially similar to the tenth embodiment except for the configuration of the heat conductor 3. As shown, the heat conductor 3 has a greater diameter than the hollow cylindrical member 22. The cylindrical member 22 is received in the heat conductor 3. The silicone gel 4 is injected into the gap between the heat conductor 3 and the cylindrical member 22.

Figure 14:
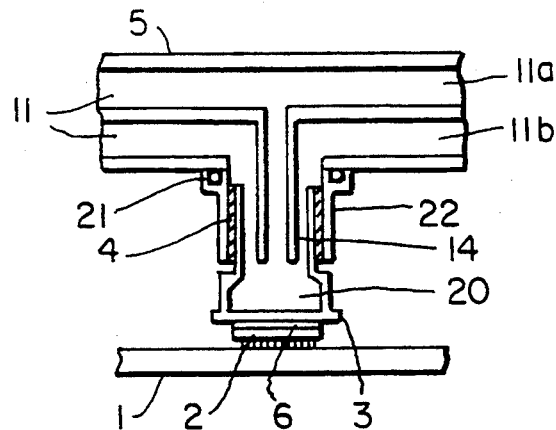

Referring to FIG. 14, a twelfth embodiment of the present invention is essentially similar to the tenth embodiment except for the configuration of the heat conductor 3. As shown, the lower end portion of the heat conductor 3 is greater in diameter than the other portion. The lower end of the heat conductor 3 is broad enough to sufficiently cover the IC 2. Hence, the entire surface of the IC 2 can be cooled even when the cylindrical member 22 has a relatively small diameter. Since the cylindrical member 22 can be provided with a small diameter, it is possible to arrange a greater number of cylindrical members 22 in a given area than in the tenth embodiment. Therefore, this embodiment is particularly feasible for the high density packaging of ICs.

Figure 15:
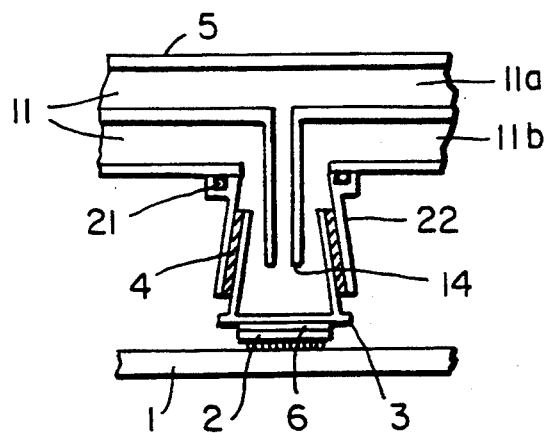

Referring to FIG. 15, a thirteenth embodiment of the present invention is essentially similar to the tenth embodiment except for the configurations of the hollow cylindrical member 22 and heat conductor 3. As shown, the cylindrical member 22 is flared from the upper end to the lower end, i.e., the diameter sequentially increases as the distance from the cold plate 5 increases. The heat conductor 3 is also flared from the upper end to the lower end. Since both the cylindrical member 22 and the heat conductor 3 are flared, the flat portion of the heat conductor 3 has an area great enough to cover the IC 2 despite that the diameter of the member 22 adjoining the cold plate 5 is small.

This embodiment, like the twelfth embodiment, is advantageously applicable to the high density packaging of ICs 2. Essentially, the present embodiment is characterized in that the cylindrical member 22 and heat conductor 3 are each provided with a flared configuration. It follows that such a configuration of the members 22 and 3 is also applicable to the eleventh embodiment, FIG. 13.

Figure 16:
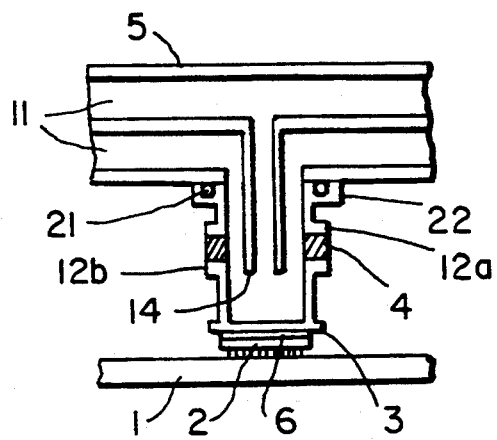

FIG. 16 shows a fourteenth embodiment of the present invention which is essentially similar to the tenth embodiment except for the configurations of the hollow cylindrical member 22 and heat conductor 3. As shown, the cylindrical member 22 has a flange 12b at the upper end thereof. Likewise, the heat conductor 3 has a flange 12a at the upper end thereof. The silicone gel 4 fills up the gap between the flanges 12a and 12b, thereby bonding the cylindrical member 22 and heat conductor 3. In this embodiment, the deformation of the silicone gel 4 is derived mainly from a normal stress, as in the third embodiment. This is successful in achieving bond as reliable as in the third embodiment.

In summary, in accordance with the present invention, a heat conductor is implemented by a single member and, therefore, has high heat conductivity. Further, since the heat conductor has a flat portion contacting an IC, the heat conductor and IC contact each other over a broad area. In addition, the heat conductor 3 is sufficiently strong and has a minimum chance of damage.

The invention may be embodied in other specific forms without departing from the spirit or essential characteristics thereof. For example, in the embodiments shown and described, the heat conductor 3 is held by the silicone gel 4. However, the silicone gel 4 is given as an example and may be replaced with any other elastic substance equivalent in characteristic to the silicone gel 4. The heat conductor 3 may be provided with a rectangular shape, whether it be hollow or not, in place of a cylindrical shape shown and described. Further, the major characteristic features of the various embodiments may be combined in a desired manner. The present embodiment is therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A structure for cooling an integrated circuit (IC), comprising:
    a printed circuit board;
    an IC mounted on said printed circuit board;
    a cold plate provided on said printed circuit board;
    a hollow cylindrical member mounted on said cold plate;

a heat conductor comprising a hollow cylindrical portion and a flat portion closing one end of said hollow cylindrical portion, said hollow cylindrical portion being inserted in said hollow cylindrical member while said flat portion connected to a top surface of said IC;

an elastic material injected into a gap between said hollow cylindrical member and said heat conductor to movably hold said heat conductor on said hollow cylindrical member such that said elastic material will compensate for irregularities of the mounting of said IC on said printed circuit board, wherein said hollow cylindrical member, said heat conductor, and said elastic material form a receptacle, and said elastic material prevents a coolant from flowing outside said receptacle; and a passageway formed in said cold plate for feeding said coolant into said heat conductor.

2. A structure for cooling an IC, comprising:
a printed circuit board;
an IC mounted on said printed circuit board;
a cold plate provided on said printed circuit board;
a passageway formed in said cold plate for causing coolant to flow therethrough;
a hole formed in said cold plate and communicating to said passageway;
a cylindrical flange surrounding said hole;
a heat conductor inserted into said cylindrical flange and connected to said IC;
an elastic material injected into a gap between said cylindrical flange and said heat conductor to movably hold said heat conductor on said cold plate such that said elastic material will compensate for irregularities of the mounting of said IC on said printed circuit board, and said elastic material prevents said coolant from flowing outside said cold plate.

3. A structure as claimed in claim 2, wherein said heat conductor is provided with fins.

4. A structure as claimed in claim 2, wherein said passageway comprises a first passageway in which said hole is formed, and a second passageway in which a nozzle is fitted for jetting said coolant toward said heat conductor.

5. A structure as claimed in claim 4, wherein said heat conductor comprises a recess facing said passageway.

6. A structure for cooling an IC, comprising:
a printed circuit board;
an IC mounted on said printed circuit board;
a cold plate provided on said printed circuit board;
a passageway formed in said cold plate for causing coolant to flow therethrough;
a hole formed in said cold plate and communicating to said passageway;
a heat conductor connected to said IC and having a flange extending out from its periphery;
an injected elastic bonding material bonded in a gap between said cold plate and said flange of said heat conductor to movably hold said heat conductor on said cold plate such that said elastic material will compensate for irregularities of the mounting of said IC on said printed circuit board, and said elastic material prevents said coolant from flowing outside said cold plate.

7. A structure as claimed in claim 6, wherein said heat conductor is provided with fins.

8. A structure as claimed in claim 6, wherein said passageway comprises a first passageway in which said hole is formed, and a second passageway in which a nozzle is fitted for jetting said coolant toward said heat conductor.

9. A structure for cooling an IC, comprising:
a printed circuit board;
an IC mounted on said printed circuit board;
a cold plate provided on said printed circuit board;
a first passageway formed in said cold plate for causing a coolant to flow therethrough;
a second passageway formed in said cold plate for causing said coolant to flow therethrough;
a hole formed in said cold plate and communicating to said second passageway;
a hollow cylindrical member mounted on said cold plate so as to surround said hole;
a heat conductor comprising a hollow cylindrical portion and a flat portion closing one end of said hollow cylindrical portion, said hollow cylindrical portion being inserted in said hollow cylindrical member while said flat portion is connected to a top surface of said IC;

an elastic material injected into a gap between said hollow cylindrical member and said heat conductor to movably hold said heat conductor on said hollow cylindrical member such that said elastic material will compensate for irregularities of the mounting of said IC on said printed circuit board, wherein said hollow cylindrical member, said heat conductor, and said elastic material form a receptacle, and said elastic material prevents said coolant from flowing outside said receptacle; and a nozzle for jetting the said coolant flowing through said first passageway into said heat conductor.

10. A structure for cooling an IC, comprising:
a printed circuit board;
an IC mounted on said printed circuit board;
a cold plate provided on said printed circuit board;
a first passageway formed in said cold plate for causing a coolant to flow therethrough;
a second passageway formed in said cold plate for causing said coolant to flow therethrough;
a hole formed in said cold plate and communicating to said second passageway;
a hollow cylindrical member mounted on said cold plate so as to surround said hole;
a heat conductor comprising a hollow cylindrical portion and a flat portion closing one end of said hollow cylindrical portion, said hollow cylindrical portion receiving said hollow cylindrical member therein while said flat portion is connected to a top surface of said IC;

an elastic material injected into a gap between said hollow cylindrical member and said heat conductor to movably hold said heat conductor on said hollow cylindrical member such that said elastic material will compensate for irregularities of the mounting of said IC on said printed circuit board, wherein said hollow cylindrical member, said heat conductor, and said elastic material form a receptacle, and said elastic material prevents said coolant from flowing outside said receptacle; and a nozzle for jetting the said coolant flowing through said first passageway into said heat conductor.

11. A structure as claimed in any one of claims 1, 10 or 10, wherein said heat conductor has a greater diameter at a closed end portion thereof than at the other portion.

12. A structure as claimed in any one of claims 1, 10 or 10, wherein said heat conductor has a diameter sequentially increasing as a distance from said cold plate increases, said hollow cylindrical member having a diameter sequentially increasing as said distance from said cold plate increases.

13. A structure for cooling an IC, comprising:
a printed circuit board;
an IC mounted on said printed circuit board;
a cold plate provided on said printed circuit board;
a passageway formed in said cold plate for causing a coolant to flow therethrough;
a hole formed in said cold plate and communicating to said passageway;
a hollow cylindrical member mounted on said cold plate so as to surround said hole and provided with a first flange around one end thereof;
a heat conductor comprising a hollow cylindrical portion, a flat portion closing one end of said hollow cylindrical portion, and a second flange surrounding said one end of said hollow cylindrical portion, said flat portion is connected to a top surface of said IC;
an elastic material injected into a gap between said first flange and said second flange to movably hold said heat conductor on said first flange of said hollow cylindrical member such that said elastic material will compensate for irregularities of the mounting of said IC on said printed circuit board, wherein said cylindrical member, said heat conductor, and said elastic material form a receptacle, and said elastic material prevents said coolant from flowing outside said receptacle; and
a nozzle for jetting said coolant flowing through said first passageway into said heat conductor.

14. A structure as claimed in any one of claims 1, 3-11 or 13, further comprising a compound interposed between said heat conductor and said IC.

15. A structure as claimed in any one of claims 1, 3-11 or 14, wherein said elastic material comprises silicone gel.

* * * * *

UNITED STATES PATENT AND TRADEMARK OFFICE
CERTIFICATE OF CORRECTION

PATENT NO.   : 5,420,753
DATED        : May 30, 1995
INVENTOR(S)  : Shinya AKAMATSU, et al It is certified that errors appears in the above-identified patent and that said Letters Patent is hereby corrected as shown below:

Col. 7, line 42 & 43, delete "adhievable", insert -- achievable --

Col. 10, line 65, delete "10", insert -- 9 --

Col. 11, line 1, delete "10", insert -- 9 --

Signed and Sealed this

Twenty-eighth Day of November 1995

Attest:

BRUCE LEHMAN

*Attesting Officer*      *Commissioner of Patents and Trademarks*